United States Patent [19]

Kramer et al.

[11] Patent Number: 6,014,044
[45] Date of Patent: Jan. 11, 2000

[54] VOLTAGE COMPARATOR WITH FLOATING GATE MOS TRANSISTOR

[75] Inventors: Alan Kramer, Berkeley, Calif.;
Roberto Canegallo, Tortona, Italy;
Mauro Chinosi, Cologno Monzese, Italy; Giovanni Gozzini, Polassolo, Italy; Philip Leong, Kowloon, The Hong Kong Special Administrative Region of the People's Republic of China; Marco Onorato, Genoa, Italy; Pier Luigi Rolandi, Volpedo, Italy; Marco Sabatini, Brescia, Italy

[73] Assignee: STMicroelectronics S.r.l., Agrate Brianza, Italy

[21] Appl. No.: 08/960,186

[22] Filed: Oct. 29, 1997

[30] Foreign Application Priority Data

Oct. 30, 1996 [EP] European Pat. Off. .............. 96830551

[51] Int. Cl.[7] .................................................. H03K 5/153
[52] U.S. Cl. ................................ 327/81; 327/80; 327/85
[58] Field of Search ............................... 327/63, 68, 72, 327/77, 78, 80, 81, 85, 87

[56] References Cited

U.S. PATENT DOCUMENTS

| 4,175,290 | 11/1979 | Harari | 365/185.07 |
|---|---|---|---|
| 4,812,681 | 3/1989 | Pumphrey | 307/362 |
| 4,890,259 | 12/1989 | Simko | 365/45 |
| 5,237,326 | 8/1993 | Jeong | 341/160 |
| 5,247,299 | 9/1993 | Lim et al. | 341/136 |
| 5,336,937 | 8/1994 | Sridhar et al. | 307/201 |
| 5,376,935 | 12/1994 | Seligson | 341/136 |
| 5,394,359 | 2/1995 | Kowalski | 365/185.24 |
| 5,451,952 | 9/1995 | Yamazaki et al. | 341/158 |
| 5,587,603 | 12/1996 | Kowshik | 257/316 |
| 5,847,993 | 12/1998 | Dejenfelt | 365/185.1 |

FOREIGN PATENT DOCUMENTS

| 0 541 110 A2 | 5/1993 | European Pat. Off. | H03M 1/12 |
|---|---|---|---|
| 57017223 | 1/1982 | Japan | H03K 13/02 |

*Primary Examiner*—Toan Tran
*Attorney, Agent, or Firm*—Theodore E. Galanthay; E. Russell Tarleton; Seed and Berry LLP

[57] ABSTRACT

This invention relates to a voltage comparator with an input for an analog signal and an output for a digital signal, comprising an inverter which has an input coupled to the comparator input and an output coupled to the comparator output, and comprising at least two MOS transistors coupled to each other, at least one of the two MOS transistors being of the floating gate type.

17 Claims, 3 Drawing Sheets

VOLTAGE COMPARATOR WITH FLOATING GATE MOS TRANSISTOR

TECHNICAL FIELD

This invention relates to voltage comparators and to analog-to-digital converters incorporating voltage comparators.

BACKGROUND OF THE INVENTION

Simple, easily integrated voltage comparators are known. U.S. Pat. No. 4,812,681 discloses a comparator formed of two cascade connected inverters of NMOS type. U.S. Pat. Nos. 5,237,326 and 5,451,952 respectively disclose two different comparators based on respective inverters of CMOS type, and two analog-to-digital converters of the flash type employing multiple comparators.

With all of the above comparators, an accurate setting of the threshold voltage is not readily achieved, since the threshold voltage is dependent on an external reference voltage and/or on the W/L ratii.

SUMMARY OF THE INVENTION

It is an object of this invention to provide a comparator which is integratable in a simple and easy manner, and wherein the threshold voltage is easy to set accurately.

By using, as the comparator element, an inverter comprised of at least two MOS transistors, of which at least one is a floating gate type, the threshold voltage of the comparator can be readily set by "programming" the floating gate MOS transistor.

As is well known, floating gate MOS transistors are MOS transistors having, at their channel area location, beneath their gate terminal, an additional gate which is isolated from such gate terminal and channel. The threshold voltage of these transistors is dependent on the amount of charge present on their floating gate. Several ways of programming such transistors, i.e., of injecting/extracting charge into/from their floating gates, are known from the literature. In view of the widespread application gained by these transistors in the field of semiconductor memory digital circuits, such as UV_EPROMs, EEPROMs, FLASH_EPROMs, abundant literature is available on the subject for details on both their technological and circuit design aspects.

This invention further relates to analog-to-digital converters utilizing the inventive comparator

DETAILED DESCRIPTION OF THE INVENTION

Figure 1:
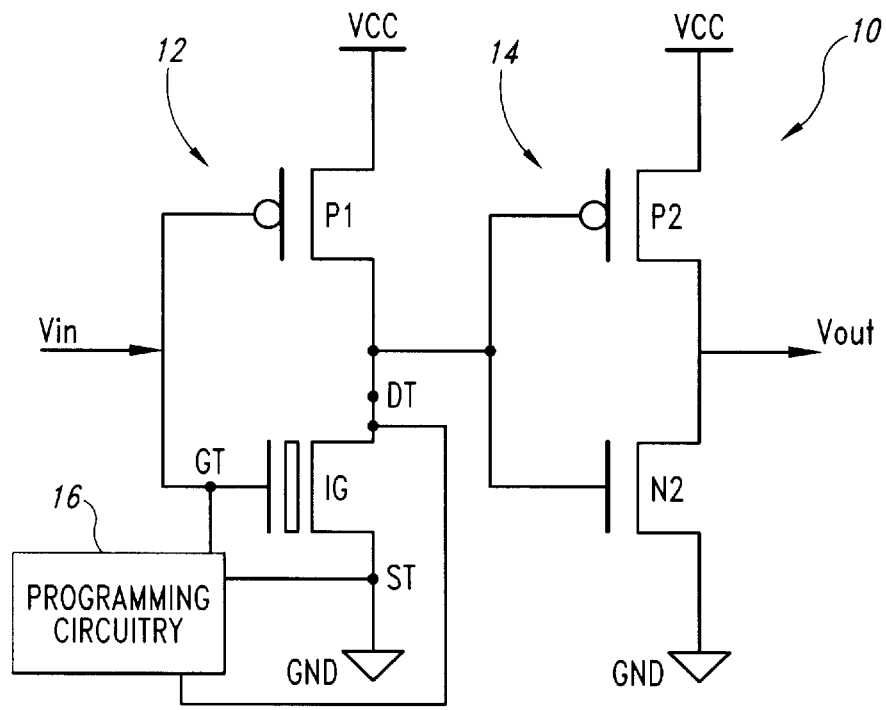
FIG. 1 shows a comparator according to the invention.

Referring to FIG. 1, the voltage comparator 10 of an embodiment of this invention has an analog signal input Vin and a digital signal output Vout, and includes a first inverter 12, having an input coupled to the input Vin and an output coupled to the output Vout, which comprises at least two MOS transistors, P1 and IG, coupled to each other, of which at least one, e.g., the transistor IG, is of the floating gate type.

As is known, the threshold voltage of an inverter of either the NMOS or PMOS or CMOS type depends, inter alia, on the threshold voltages of the MOS transistors forming it, as well as on their W/L ratii. Thus, if at least one of the MOS transistors is of the floating gate type, the threshold voltage of the inverter can be controlled by controlling the threshold voltage of the floating gate transistor, i.e., by programming it.

Figure 2:
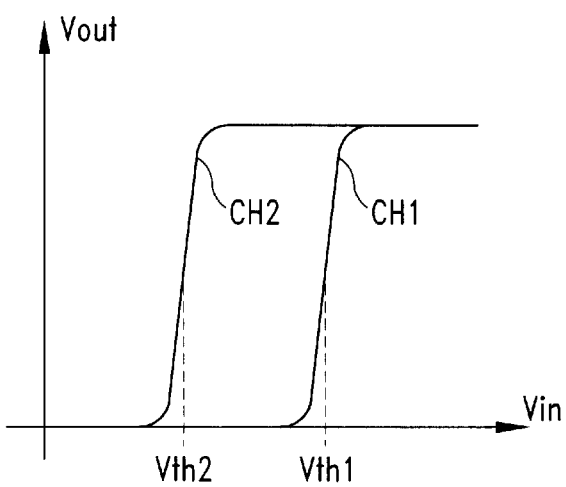
FIG. 2 shows two characteristics of respective comparators according to the invention.

Shown in FIG. 2 are two different input/output characteristics CH1 and CH2 of the comparator in FIG. 1, which correspond to two threshold voltage values of the transistor IG and have two different threshold voltages Vth1 and Vth2.

It is quite common for floating gate MOS transistors to be of the N-channel type, although they may also be of the P-channel type, as taught in U.S. Pat. No. 5,589,701 and U.S. patent application Ser. No. 08/613,445.

In the comparator of FIG. 1, the MOS transistor P1 is of the P-channel type and MOS transistor IG is of the floating gate N-channel type. Specifically for transistor P1, its gate terminal is connected to the input Vin, its source terminal is connected to a power supply VCC, and its drain terminal is connected to the inverter output. For transistor IG, its floating gate terminal GT is connected to the input Vin, its drain terminal DT is connected to the inverter output, and its source terminal ST is connected to a ground GND. Such an inverter is referred to as a CMOS type, and has virtually no current consumption.

Further details pertaining to CMOS-type inverters can be found, for example, in a textbook "Digital CMOS Circuit Design" by M. Annaratone, Kluwer Academic Publishers, 1986, in particular under paragraphs 2.5 and 2.6, being incorporated herein by reference.

Also, the comparator of FIG. 1 includes a second inverter 14, adapted to function as an output buffer, which is coupled between the output of the first inverter and the comparator output Vout. Specifically, the second inverter comprises an N-channel MOS transistor N2 having its source terminal connected to a ground GND, its gate terminal connected to the output of the first inverter, and its drain terminal connected to the output Vout. The second inverter also includes a P-channel MOS transistor P2 having its source terminal connected to the power supply VCC, its gate terminal connected to the output of the first inverter, and its drain terminal connected to the output Vout. In this way, greater freedom is allowed in the choice of the W/L ratios for the various MOS transistors; usually, in fact, the levels of the digital signal at the output Vout would be predetermined.

Figure 4:
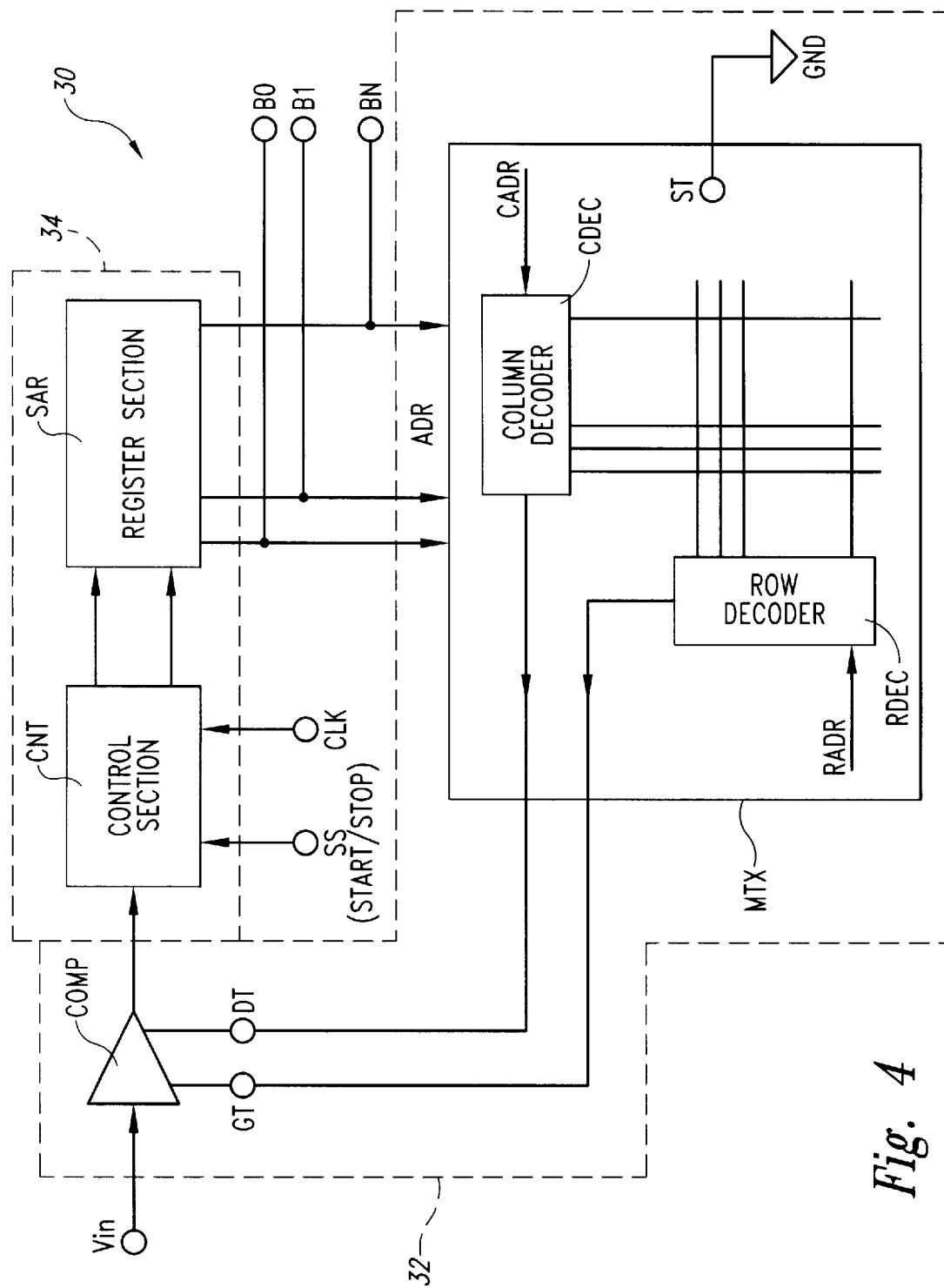
FIG. 4 shows an analog-to-digital converter of the successive-approximation type according to the invention.

The comparator of this invention may comprise a matrix MTX of floating gate MOS transistors as shown schematically in FIG. 4. The floating gate MOS transistors of the matrix MTX coupleable selectively and alternatively to the other MOS transistor P1 of the first inverter. The advantage of this implementation will be explained more clearly hereinafter.

It can be advantageous if the comparator of this invention further includes programming circuitry 16 for programming the floating gate MOS transistor(s)or the matrix MTX. The programming circuit 16 being controllably operative to couple the floating gate MOS transistor or transistors to predetermined programming potentials. In this way, full versatility can be obtained of the comparator. Examples of such a programming circuitry 16 are well known in the art.

Figure 3:
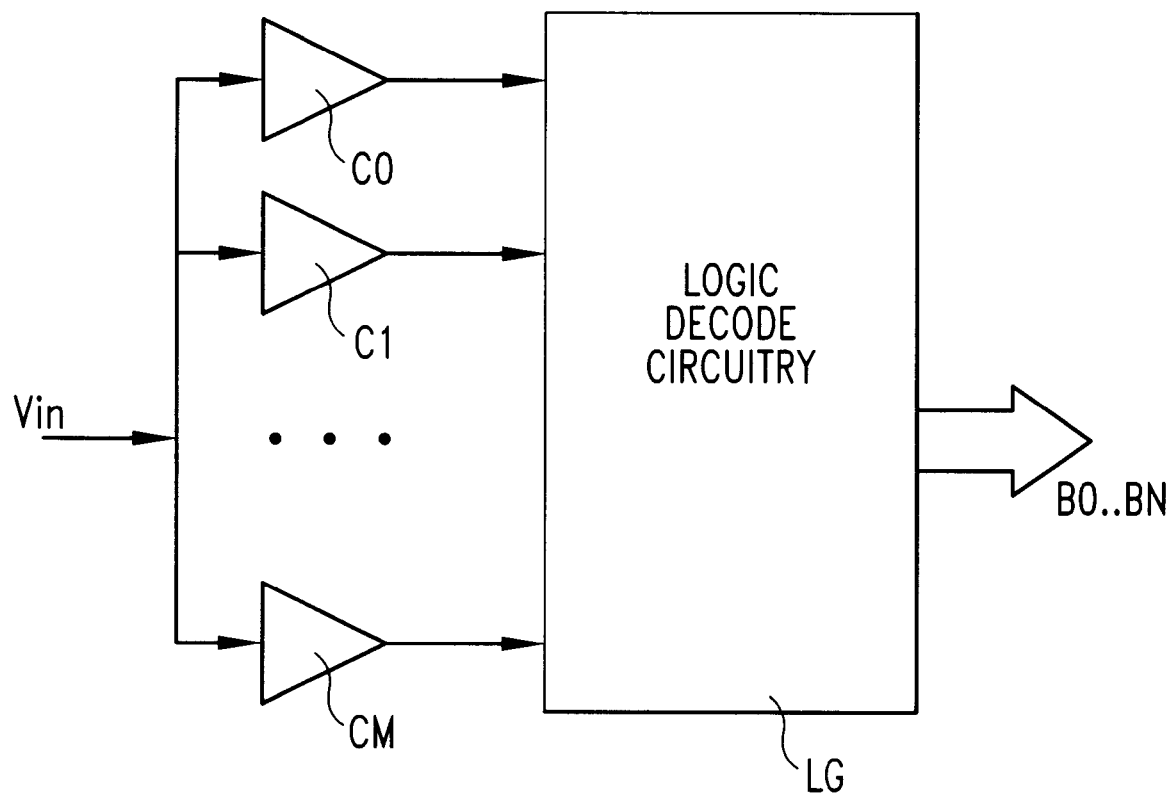
FIG. 3 shows an analog-to-digital converter of the flash type according to the invention.

Referring to FIG. 3, an analog-to-digital converter 20 according to a first embodiment of the invention has an input Vin for an analog signal and a plurality of outputs B0, . . . , BN for digital signals, a plurality of comparators C0, . . . , CM, according to the invention and logic decode circuitry LG. Each of the comparators C0-CM may be implemented using the comparator 10 shown in FIG. 1. Further, the comparators C0-CM have their inputs jointly coupled to the converter input Vin and their outputs coupled to inputs of the logic decode circuitry LG. The logic decode circuitry LG also includes outputs coupled to the converter outputs B0-BN.

Understandably, the comparators C0, . . . , CM have different threshold voltages from one another, which are programmed once or during the operation of the converter 20.

If the number M of the comparators C0, . . . , CM equals two raised to a power of N, the index N being the number of the outputs B0, . . . , BN of the converter, then the outputs of the logic decode circuitry LG will be respectively connected to the outputs B0, . . . , BN. Such a converter is referred to as a flash type, and the conversion law will be determined by the values of the threshold voltages of the comparators C0, . . . , CM.

One analog-to-digital converter of the flash type is known from U.S. Pat. No. 5,237,326 ("the '326 patent"), which is incorporated hereto by reference. A block diagram of flash-type analog-to-digital converter is shown in FIG. 1 of the '326 patent, while FIG. 2 of the '326 patent shows a circuit diagram of a priority encoder which can be employed to implement the logic decoder circuitry LG of the analog-to-digital converter 20.

Referring to FIG. 4, an analog-to-digital converter 30 according to a second embodiment of the invention has an input Vin for an analog signal, a plurality of outputs B0, . . . , BN for digital signals, a comparator 32, and logic control/encode circuitry 34. The comparator 32 includes a plurality of floating gate MOS transistors, an input coupled to the converter input Vin, and an output coupled to the logic control/encode circuitry 34. The logic control/encode circuitry 34 has an input coupled to the output of the comparator 32 and outputs coupled to the outputs B0-BN of the converter 30 and is adapted to select one of the plurality of floating gate MOS transistors for coupling.

Such a comparator 32 may be formed, as shown in FIG. 4, of a block COMP and a block MTX. The block COMP may correspond, for example, to the comparator 10 shown in FIG. 1, without the transistor IG, and has two terminals GT and DT respectively corresponding to the gate and drain terminals of the transistor IG. The block MTX may comprise a matrix of floating gate MOS transistors, a column decoder CDEC and a row decoder RDEC.

The block MTX includes an address input ADR that includes plural lines for receiving an address signal which is effective to select one of the floating gate MOS transistors in the matrix. The matrix is represented schematically by a mesh of column and row lines with a floating gate MOS transistor being located at each intersection of one column line with one row line. Each floating gate MOS transistor has its drain terminal connected to one of the column lines, its gate terminal connected to one of the row lines, and its source terminal ST connected to the ground GND. The address lines ADR are divided into two groups: a first group, for column address lines CADR and row address lines RADR. The column address lines CADR, identifying a column address, are connected to inputs of the column decoder CDEC, and the row address lines RADR, identifying a row address, are connected to inputs of the row decoder RDEC. These decoders CDEC, RDEL can connect only one of the respective lines to their respective outputs. That is, when an address is input to the block MTX, the block COMP will be coupled to only one floating gate MOS transistor in the matrix.

The logic control/encode circuitry 34 can be implemented in more than one way. The logic control/encode circuitry 34 may be of the type intended for successive-approximation converters and comprise a control section CNT and a register section SAR. The control section connected to the output of the comparator COMP and has a clock input CLK and a start/stop input SS. The register section SAR has inputs connected to outputs of the control section CNT and has outputs connected both to the converter outputs B0, . . . , BN and to the address input lines ADR. The logic control/encode circuitry 34 circuitry is operative to select the floating gate MOS transistors of the matrix MTX by a binary search of some form.

One analog-to-digital converter of the successive-approximation type is disclosed in U.S. Pat. No. 5,247,299 ("the '299 patent"), which is incorporated herein by reference. FIG. 1 of the '299 patent is a block diagram that is particularly relevant.

The logic control/encode circuitry 30 is also useful with slope converters. In this case, the logic control/enable circuitry 30 would be operative to select MOS transistors of the matrix with gradually increasing or decreasing threshold voltages, until the threshold voltage value of the comparator COMP exceeds the voltage value at the input Vin in either the positive or the negative direction.

It should be understood that even though numerous features and advantages of the present invention have been set forth in the foregoing description, the above disclosure is illustrative only. Changes may be made in detail and yet remain within the broad principles of the present invention.

We claim:

1. A voltage comparator, comprising:
   an input for an analog signal;
   an output for a digital signal;
   a first inverter which has an input coupled to the comparator input, an output coupled to the comparator output, and at least two MOS transistors coupled to each other, at least one of the MOS transistors is of the floating gate type and the at least two MOS transistors include a non-floating gate first MOS transistor and a floating gate second MOS transistor selected from a plurality of floating gate MOS transistors, arranged into a matrix, which are selectively and alternatively coupleable to the first MOS transistor of the first inverter.

2. A comparator according to claim 1 wherein one of the MOS transistors is of the P-channel type and another is of the N-channel floating gate type.

3. A comparator according to claim 1, further comprising a second inverter adapted to function as an output buffer and being coupled between the output of the first inverter and the output of the comparator.

4. A comparator according to claim 1, further comprising programming circuitry for programming the at least one floating gate MOS transistor and controllably adapted for coupling the at least one floating gate MOS transistor to predetermined programming potentials.

5. An analog-to-digital converter having an input for an analog signal and a plurality of outputs for digital signals, and comprising:
   a) a comparator that includes an input coupled to the converter input, an output, and a plurality of floating gate MOS transistors; and
   b) logic control/encode circuitry having an input coupled to the output of said comparator and having outputs coupled to the analog-to-digital converter outputs, the logic control/encode circuitry being operative to select one of said plurality of floating gate MOS transistors for coupling between the comparator input and the comparator output.

6. A converter according to claim 5 wherein said logic control/encode circuitry is includes successive-approximation logic control circuitry.

7. A converter according to claim 5 wherein said logic control/encode circuitry includes slope conversion logic control circuitry.

8. The converter of claim 5 wherein the plurality of floating gate MOS transistors is part of a matrix of floating gate MOS transistors, each floating gate MOS transistor of the matrix being selectively coupled between the comparator input and the comparator output under control of the logic control/encode circuitry.

9. The converter of claim 8 wherein the matrix includes plural columns and plural rows of floating gate MOS transistors, the comparator further including a column decoder and a row decoder that together select a particular one of the floating gate MOS transistors of the matrix based on address signals received from the logic control/encode circuitry, the decoders coupling the selected one of the floating gate MOS transistors between the comparator input and the comparator output.

10. The converter of claim 5 wherein the comparator includes an inverter that includes first and second MOS transistors having gates coupled to each other and drains coupled to each other and being of opposite polarity with respect to each other, the second MOS transistor being a selected one of the floating gate MOS transistors.

11. The converter of claim 5 wherein the comparator includes first and second inverters, the first inverter having an input coupled to the converter input and an output coupled to an input of the second inverter, the second inverter having an output coupled to the logic control/enable circuitry, the first inverter including first and second MOS transistors, the second MOS transistor being a selected one of the floating gate MOS transistors.

12. An voltage comparator, comprising:
an input for receiving an analog signal;
an output for outputting a digital signal;
a first inverter coupled between the input and the output, the first inverter including a first transistor and a plurality of floating gate transistors selectively coupled to the first transistor between the input and the output, wherein in response to a logic control signal a selected one of the floating gate transistors is coupled to the first transistor between the input and the output.

13. The voltage comparator of claim 12 wherein the plurality of floating gate MOS transistors is part of a matrix of floating gate MOS transistors, each floating gate MOS transistor of the matrix being selectively coupled between the input and the output under control of the logic control signal.

14. The voltage comparator of claim 13 wherein the matrix includes plural columns and plural rows of floating gate transistors, the comparator further including a column decoder and a row decoder that together select a particular one of the floating gate MOS transistors of the matrix based on address signals received as the logic control signal, the decoders coupling the selected one of the floating gate MOS transistors between the input and the output.

15. The voltage comparator of claim 12 wherein the first transistor and the selected transistor have gates coupled to each other and to the input and have drains coupled to each other and to the output, the first transistor and the selected transistor being of opposite polarity with respect to each other.

16. The voltage comparator of claim 12, further comprising a second inverter, the first inverter having an input coupled to the comparator input and an output coupled to an input of the second inverter, the second inverter having an output coupled to the comparator output.

17. The voltage comparator of claim 12 wherein the first transistor includes a P-channel and the selected floating gate transistor includes an N-channel.

* * * * *